United States Patent
Das et al.

(10) Patent No.: US 6,426,636 B1
(45) Date of Patent: Jul. 30, 2002

(54) WAFER PROBE INTERFACE ARRANGEMENT WITH NONRESILIENT PROBE ELEMENTS AND SUPPORT STRUCTURE

(75) Inventors: Gobinda Das, Hopewell Junction, NY (US); Steven J. Duda, Underhill Center, VT (US); Paul M. Gaschke; Angelo M. Giaimo, both of Wappingers Falls, NY (US); Frederick L. Taber, Jr., LaGrangeville; John F. Vetrero, Highland, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/022,240

(22) Filed: Feb. 11, 1998

(51) Int. Cl.⁷ ............................................... G01R 31/02
(52) U.S. Cl. ....................................... 324/754; 324/755
(58) Field of Search ................................ 324/754, 755, 324/757, 758, 760, 761, 762, 158.1

(56) References Cited

U.S. PATENT DOCUMENTS

| | | | |
|---|---|---|---|
| 4,038,599 A | | 7/1977 | Bove et al. .................. 324/754 |
| 4,673,839 A | | 6/1987 | Veenendaal .................. 310/338 |
| 4,912,399 A | * | 3/1990 | Greub et al. .................. 324/754 |
| 5,012,187 A | | 4/1991 | Littlebury .................... 324/754 |
| 5,042,668 A | | 8/1991 | Hunt et al. ................... 209/539 |
| 5,066,907 A | | 11/1991 | Tarzwell et al. ............. 324/758 |
| 5,207,585 A | * | 5/1993 | Byrnes et al. ................. 439/66 |
| 5,521,522 A | | 5/1996 | Abe et al. .................... 324/758 |
| 5,550,482 A | | 8/1996 | Sano ........................... 324/758 |
| 5,559,446 A | | 9/1996 | Sano ........................... 324/760 |
| 5,570,032 A | | 10/1996 | Atkins et al. ................ 324/760 |
| 5,592,736 A | * | 1/1997 | Akram et al. ................. 29/842 |
| 5,604,446 A | * | 2/1997 | Sano ........................... 324/758 |
| 5,929,521 A | * | 7/1999 | Wark et al. .................. 257/737 |
| 5,931,685 A | * | 8/1999 | Hembree et al. .............. 439/74 |
| 5,940,729 A | * | 8/1999 | Downes, Jr. et al. ........ 438/613 |
| 5,949,242 A | * | 9/1999 | Wood et al. ................. 324/760 |
| 5,952,840 A | * | 9/1999 | Farnworth et al. .......... 324/755 |

* cited by examiner

Primary Examiner—N. Le
Assistant Examiner—T. R. Sundaram
(74) Attorney, Agent, or Firm—Robert A. Walsh

(57) ABSTRACT

A nonresilient rigid test probe arrangement which is designed for testing the integrity of silicon semiconductor device wafers or chips, and which eliminates pliant conditions encountered by current text fixtures, which are adverse to the attainment of satisfactory test results with rigid probes. The test system interface assembly includes a rigid ceramic substrate which forms a pedestal over which the rigid probe makes electrical contact. A PC board is located on the opposite side of the ceramic substrate. A clamp ring retains the PC board to a test head system with mating precision reference surfaces formed therebetween. Pogo pin connectors extend between the PC board and the test head system. A stiffening element having a control aperture is bolted through the PC board to the clamp ring, all of which form a rigid test probe arrangement.

11 Claims, 7 Drawing Sheets

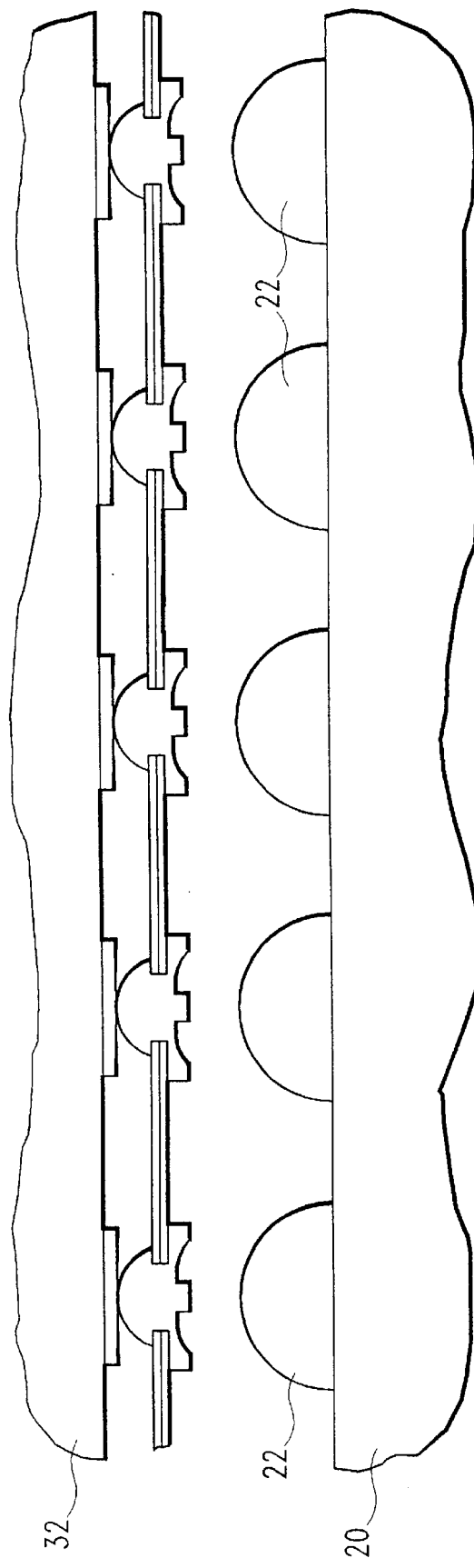
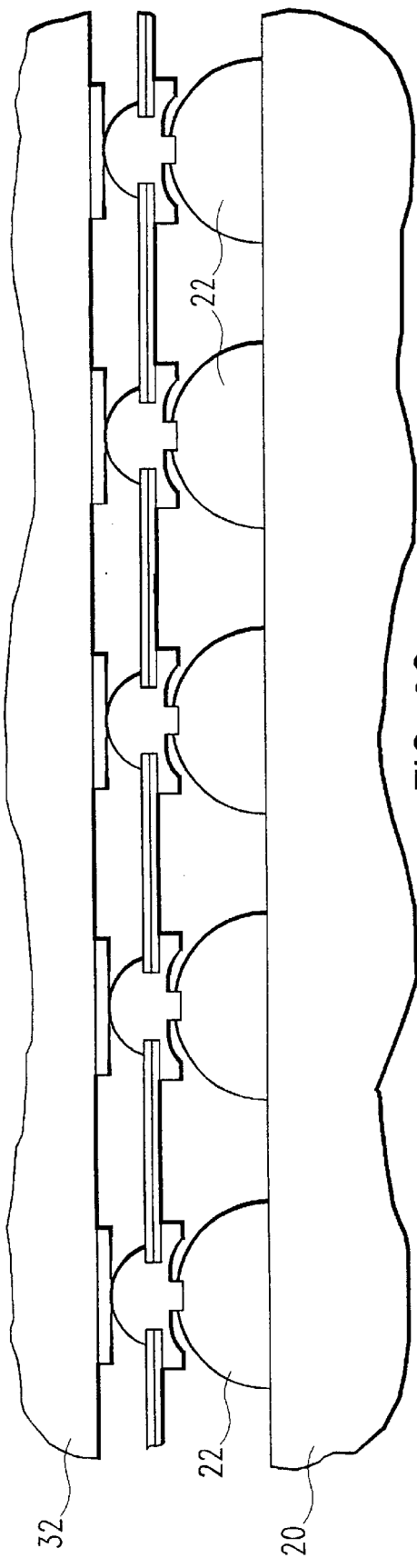
FIG. 2B
FIG. 2C

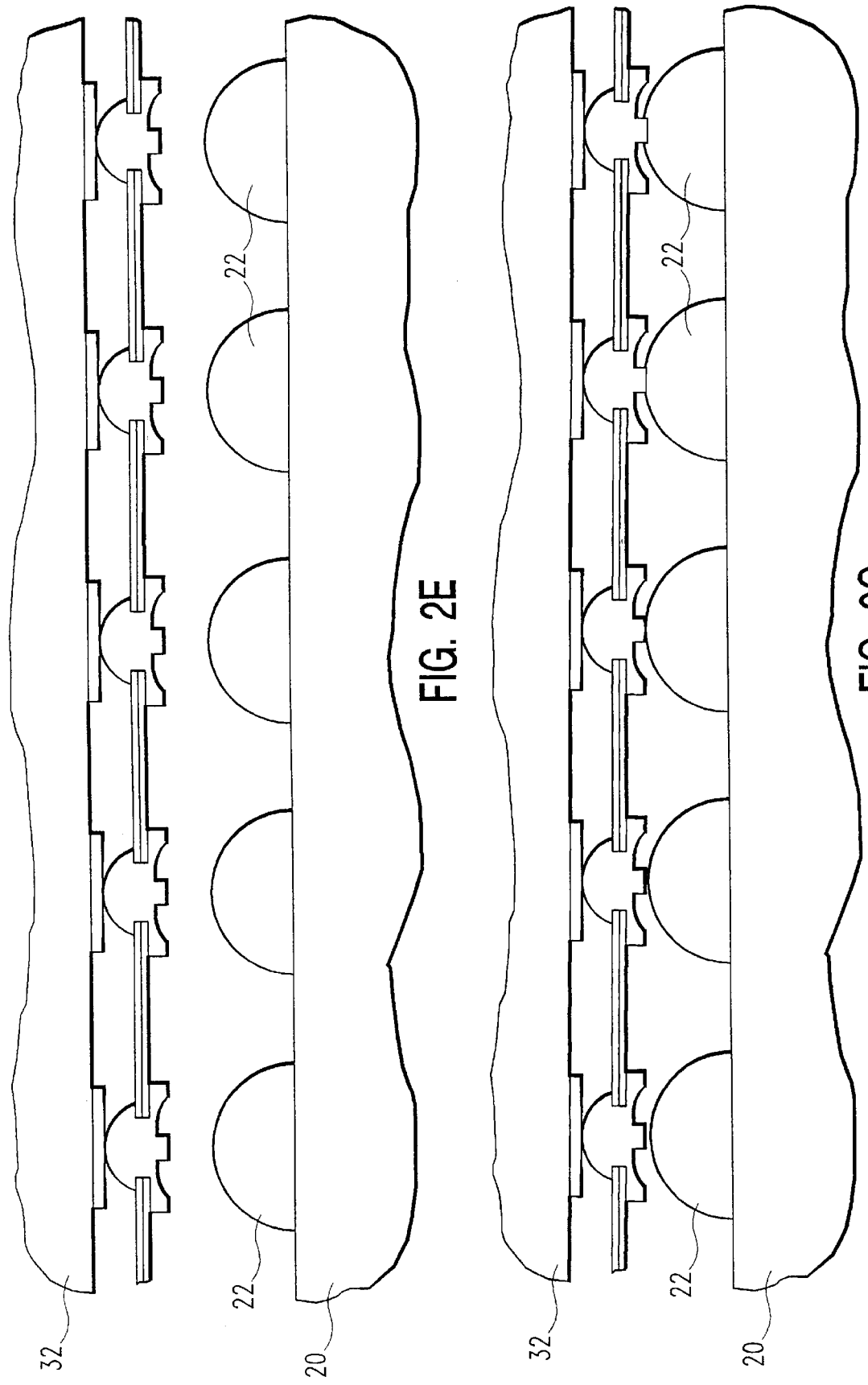

WAFER PROBE INTERFACE ARRANGEMENT WITH NONRESILIENT PROBE ELEMENTS AND SUPPORT STRUCTURE

BACKGROUND OF THE INVENTION

The present invention relates to a nonresilient test probe which is designed to uniformly contact pads of semiconductor devices, and more particularly pertains to a nonresilient or rigid test probe arrangement which is designed for investigating the integrity of silicon semiconductor device wafers or chips.

An extremely important facet of the semiconductor industry resides in being able to provide satisfactorily functioning semiconductor devices. In particular, such semiconductor devices may comprise wafers which are divided into areas which form chips, the shapes and dimensions of which are identical or as close to each other as is possible to obtain, so as to impart consistently uniform electrical properties thereto.

Generally, semiconductor devices on chips are ordinarily connected to each other with thin strips of metal, referred to in the art as interconnection metallurgy, which in turn contact the wafer surface through a series of pads or bumps, each 60–100 micrometers in size and situated peripherally at a pitch of 100 micrometers or less. Other connector pad configurations may include an array of electrical contacts or bumps which are distributed over an area; for instance, the widely employed C4 bumps (controlled collapse chip connects), which are usually each about 100–125 micrometers in diameter and arrayed at a pitch of about 200–250 micrometers. Such bumps or electrical contacts extend above the integrated circuits, are generally spherical or round in cross-sectional configuration, and are constituted of lead and tin (Pb—Sn).

Although silicon device wafers, which are divided into chips by being diced, are as closely uniform as possible to be produced through current manufacturing techniques, it is not always feasible that every chip can be produced so as to be perfect in nature, in view of unavoidable defects which are encountered during manufacture. In order to identify and to clearly distinguish between good and defective chips, electrical tests are performed prior to dicing of the wafers into chip areas, to thereby facilitate the sorting out of good chips and eliminating defective chips prior to the next step of manufacture.

Ordinarily, active testing of the wafers is performed by a test facility in which the pads or areas on wafers possessing arrays of bumps, such as of C4 bumps, are contacted by an assembly incorporating test probes. In order to successfully probe the integrity of the pads or bumps, it is desirable that an oxide layer, which inevitably forms on the surface of the C4 bumps, be ruptured end penetrated to ensure a good electrical contact with the probe while employing only a minimal force to inhibit damaging the pads or bumps. The plane of the test probe should be constructed to be as flat as possible so as to facilitate the simultaneous contacting of all pads or bumps by the test probe.

In recent times, so-called cobra probes have been utilized in conjunction with the probing or testing of the integrity of semiconductor device wafers possessing an area with an array of C4 bumps or similar electrical contacts. A cobra probe normally comprises a plurality of wires which are mounted in parallel with their respective ends terminating in two planes which extend transversely of the axes of the probe wires. The wires are preshaped and flexible, which fulfills two of the numerous requirements to render them highly successful in probing silicon device wafers. However, the rapid advance in semiconductor technology, in which the number of pads for I/O (Input/Output) or power/ground has increased and the devices are required to be tested at high switching speeds, has limited the use of cobra probe technology. Furthermore, the cobra wires have a tendency at times to short out to closely situated adjacent wires or to carry dirt and fragments which are dropped on the array of bumps or chips being tested and which can cause short or open circuits therein.

Moreover, peripheral probing of CMOS semiconductor devices with the use of cantilever probes has been extremely successful in the semiconductor industry. Nevertheless, increased semiconductor device contact or bump densities leading to closer pitch and reduced pad size requirements, have resulted in a requirement for more precise alignment and closer planarity in peripheral probing. This type of probing also faces technological challenges and limitations in its applicability.

Membrane probe technology is also being more widely employed in order to replace previous needle-type or wire probes for the purpose of resting wafers having semiconductor device pads which are in more closely spaced relationships. Although membrane probes have been improved in recent years, they have not yet reached their full potential for peripheral probing of semiconductor device wafers. A lack of good electrical contact, or the inability of the probes to break through the oxide layer which forms on the pads, have been primary causes in the failure of membrane probes to provide satisfactory testing results.

DISCUSSION OF THE PRIOR ART

For example, cobra probes which are considered to be satisfactory for testing of semiconductor wafers or chips with C4 bumps, have been employed in this technology and are disclosed in Byrnes et al., U.S. Pat. No. 4,027,935, which is assigned to the common assignee of the present application.

Membrane or pellicle probes which have been found to be generally satisfactory in this technology for the testing of electrical contacts or C4 bumps for semiconductor devices can be ascertained from the disclosure of Byrnes et al., U.S. Pat. No. 5,207,585, which is assigned to the common assignee of the present application. Byrnes et al. utilizes an interface pellicle probe for testing semiconductor devices which comprise copper bumps on a copper-plated polyimide membrane of a material such as Kapton (registered trademark of Dupont Corp.). The distinction between the approach taken by Byrnes et al. and those previously employed for the peripheral pads is that in Byrnes et al. the top and bottom. surfaces of the probes arrayed over areas are shaped; in effect, the upper bump side providing contact with the space transformer and the lower side facing towards the semiconductor are configured so as to permit an easy penetration into the C4 bumps.

In addition to the above-mentioned Byrnes et al. U.S. patents, other publications which are concerned with diverse types of systems for the testing of the functional integrity of electrical contacts for semiconductor wafers or the like, are disclosed in Sano. U.S. Pat. No. 5,604,446; Atkins et al., U.S. Pat. No. 5.570,032; Sano, U.S. Pat. No. 5,559,446; Sano, U.S. Pat. No. 5,550,482; Abe et al., U.S. Pat. No. 5,521,522; Tarzwell et al., U.S. Pat. No. 5,066,907; Leslie and Matta, in "Membrane Probe Card Technology (The Future For High Performance Wafer Test)" in IEEE International Test Conferences; Higashi et al., U.S. Pat. No. 5,438,223; Yamamoto et al., U.S. Pat. No. 5,575,662 and Fujita, U.S. Pat. No. 5,576,630. However, many of these suffer through contact fails and none of these pertains to wafer test probes analogous to those of the present invention to be used with area array probing of C4 contacts.

In summation, heretofore for area arrays with C4 bump semiconductor device pads, cobra probes have been found to be generally satisfactory. However, more recently on the basis of ever increasing industry demands and advances in the technology, cobra probes have been challenged in their ranges of applicability. The semiconductor device densities of the chips have increased extensively along with the need for providing more device pads as test points, in effect, at a close pad pitch and size (4 on 8 mil or lower).

Moreover, the increased density or packing of more semiconductor devices on a chip requires the presence of larger chips (10–20 mm or more), and additionally requires larger bandwidths (greater than 200 MZ). A modern cobra probe assembly must contact more than 1500–2000 pads in an average chip of 15 mm size. Thus, upper and lower dies of such probe equipment become quite large and are prone to warping or arching, which frequently leads to a failure of the probing process. Furthermore, cobra probes employed in an extremely dense packing situation, particularly with large chips, are frequently prone to electrical shorts. Moreover, the normally considerable length of a cobra probe renders it unsuitable for large bandwidths. In contrast, the relatively short probes of peripherally bumped membranes could present a solution to the problem, but cannot be fully implemented because of failures related to contact resistance or non-optimized contact pressure in the implementing systems.

SUMMARY OF THE INVENTION

The present invention provides a nonresilient probe wafer interface arrangement which can be utilized with high density chips and with larger bandwidths. The arrangement also enhances wafer test capabilities beyond those attainable with conventional cobra probes.

Another object of the present invention is to determine test system parameters, such as the planarity present between a probe and a test fixture, which is required for successful wafer testing when utilizing rigid probes.

Another object of the subject invention is to eliminate pliant conditions encountered by current test fixtures, probes and the C4 bumps or pads, (run-off) which are adverse to the attainment of satisfactory results with rigid probes. Any condition of pliancy between the wafer being tested and the probe fixture assembly should be so negligible as to be practically nonexistent, to ensure practically perfect parallelism between the wafer and the test fixture.

A further object of the present invention is the provision of a test fixture and rigid probe assembly which is capable of improved testing or probing of silicon wafers, and wherein a vacuum fixture is adapted to tightly maintain the membrane probe against the conductive pads of a space transformer so as to provide good electrical contact with the semiconductor device pads during wafer testing.

A still further object is to maintain electrical contact by employing a vacuum fixture which is designed to enhance and not to adversely impact upon the efficiency of usage and throughput of the test equipment. Moreover, the tests can be readily conducted at elevated temperatures of up to about 85° C. without degrading the quality of tests which are normally attained at room or ambient temperature Yet another object of the invention is to provide for minimum deformation of the C4 bumps or pads during testing thereof by applying as low a force as possible during the testing procedure, thus enabling chips to be used as-tested or reflowed for the next step of manufacture.

BRIEF DESCRIPTION OF THE DRAWINGS

Reference may now be had to the following detailed description of a preferred embodiment of the present invention, taken in conjunction with the accompanying drawings, in which:

FIGS. 2B and 2C are enlarged schematic views of the encircled area 2B,2C of FIG. 2A, shown before (2B) and after (2C) contact to the C4 pads respectively.

FIG. 2E is an enlarged schematic view (not drawn to scale) of the encircled area 2E in FIG. 2D, showing nonplanarity between the C4 pads plane and the plane of the probes prior to contact.

FIG. 2G is an enlarged schematic view (not drawn to scale) of the encircled area 2G in FIG. 2F, showing nonuniform probe contact to the C4s.

DETAILED DESCRIPTION OF A PREFERRED EMBODIMENT

The present invention provides reliable electrical contacts between rigid probes of a variable density built on a polyimide film and devices in an undiced wafer.

Figure 1:
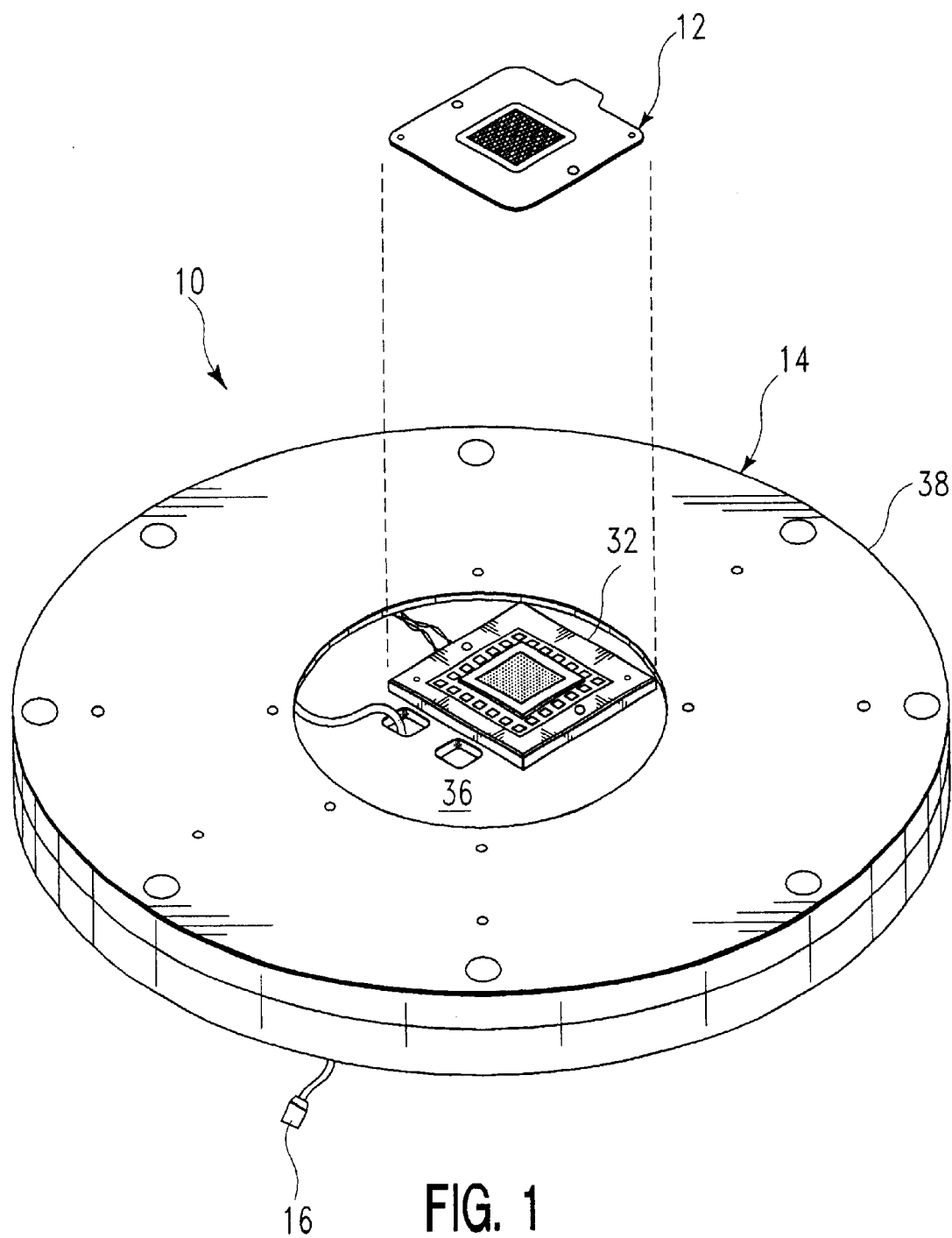
FIG. 1 illustrates a perspective view of a semiconductor wafer test system interface assembly constructed pursuant to the present invention, shown inverted for purposes of clarity.
Figure 3:
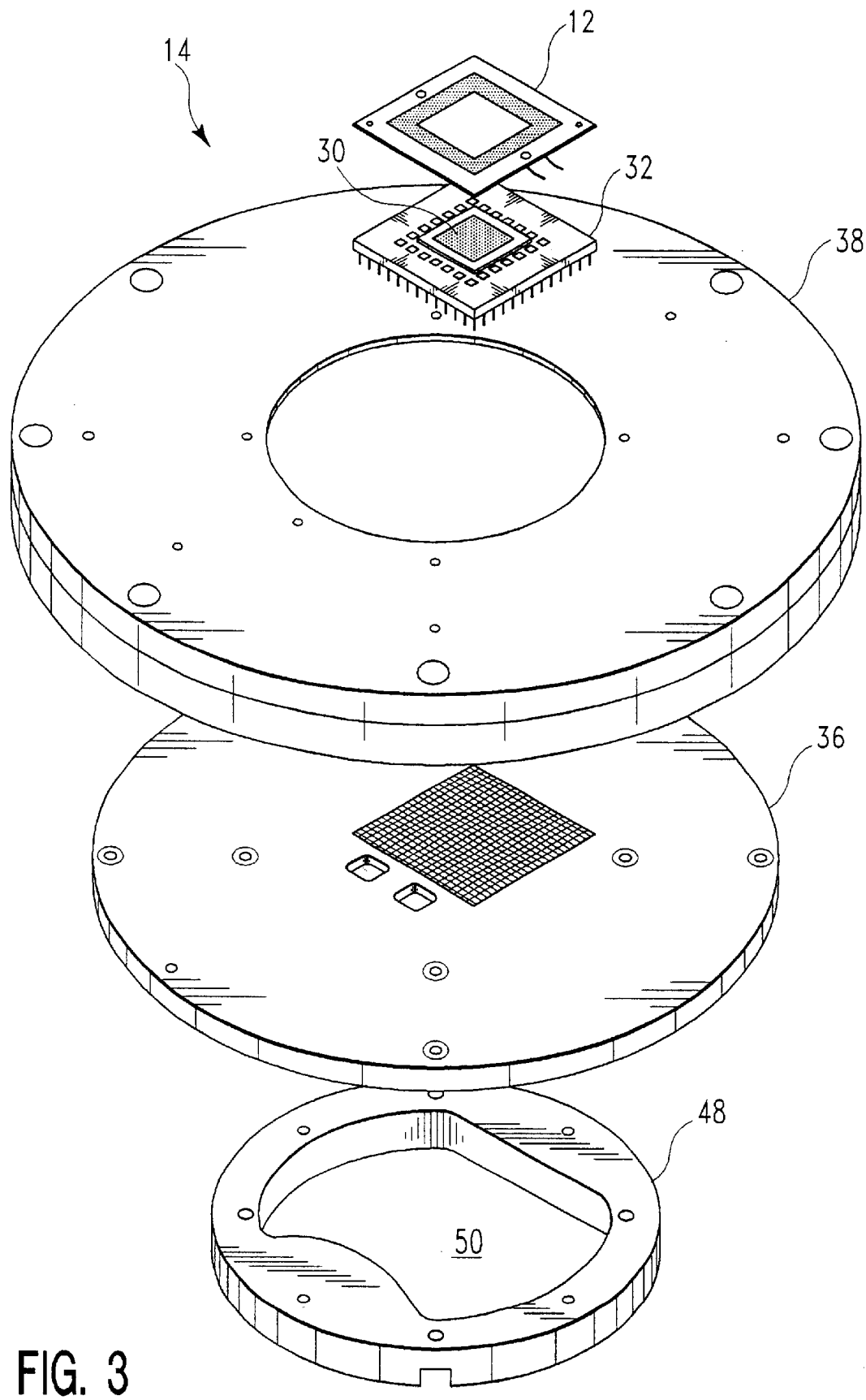
FIG. 3 illustrates, in an inverted representation as in FIG. 1, an exploded perspective view of the components of the test assembly.

FIG. 1 illustrates a perspective view of a semiconductor wafer test system interface assembly 10 constructed pursuant to the present invention, shown inverted for purposes of clarity. FIG. 3 illustrates, in an inverted representation as in FIG. 1, an exploded perspective view of the components of the test assembly.

The test system interface assembly 10, as illustrated in FIG. 1, is designed to provide for reliable and repeatable electrical contacts. The assembly 10 comprises a typical rigid probe 12 and a space transformer 14. The rigid probe 12 is aligned into its appropriate position opposite conductive areas of a ceramic substrate 32, and is then maintained in proper contact through the use of a vacuum connection arrangement 16, 34. The test assembly nonresilient probe may be a type as disclosed in Byrnes et al., U.S. Pat. No. 5,207,585, the disclosure of which is expressly incorporated by reference herein.

Figure 2A:
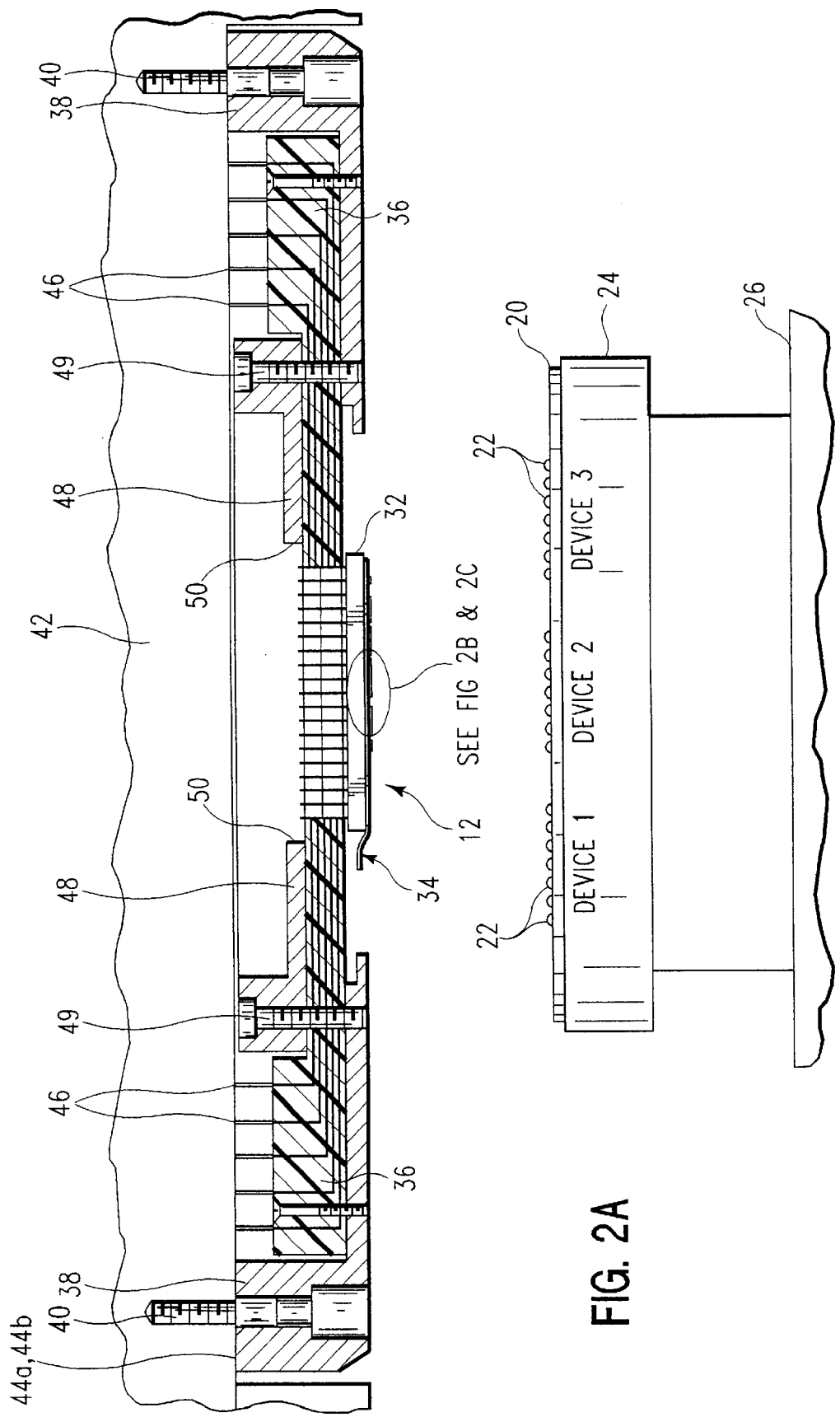
FIG. 2A illustrates a sectional view, on an enlarged scale, of the test system interface assembly of the present invention in an upright, operative position.

Referring to the drawings FIG. 2A illustrates a sectional view, on an enlarged scale, of the test system interface assembly of the present invention in an upright, operative position. FIGS. 2B and 2C are enlarged schematic views of the encircled area 2B, 2C of FIG. 2A, shown before (2B) and after (2C) contact to the C4 pads respectively. Note that the present invention allows uniform and simulteneous contact to the C4 pads. This leads to successful electrical tests as it produces even penetration into the C4 pads, as shown in FIG. 2C.

Referring to FIGS. 2A–2G and 3, a silicon wafer 20, which has C4 bumps 22 thereon and is to be tested by the test system, is mounted on a wafer chuck 24. The wafer chuck 24 is adapted to be finely adjusted in the X, Y and Z orientations by an X-Y-Z wafer stepper 26.

The test system interface assembly 10 includes a rigid ceramic substrate 32. A raised probe interface surface 30 forms a pedestal is the area of the ceramic substrate 32 over which the rigid probe 12 makes electrical contact. A vacuum manifold 34 is connected to the ceramic substrate 32. A PC board 36 is located on the opposite side of the ceramic substrate 32, and the rigid probe 12 is conductively connected to the raised probe interface 30. A clamp ring 38 retains the PC board 36 by means of fasteners 40 to a test head system 42 with mating precision reference surfaces 44a, 44b being formed therebetween. Pogo pin connectors 46 extend between the PC board 36 and the test head system 42. A stiffening element 48 having a control aperture 50 is bolted at 49 through the PC board 36 to the clamp ring 38.

As illustrated in FIG. 2A, during testing a wafer 20 is positioned on the wafer chuck 24 which is moved by fine adjustments by stepper 26 along the X, Y or Z axes, until the pads or C4 bumps 22 of a chip align with the tip of the probe. In this instance, the planes of the probe 12 and of the wafer 20 plane must be as parallel as possible, permitting all semiconductor device pads and probe interface pads which are rigid to come into simultaneous contact. The rigid probe does not posses any pliancy, and any divergence in planarity between the surfaces of the probe and wafer must be maintained below 0.2 mil.

The rigid probe 12 (TFI) does not possess any pliancy as illustrated in FIGS. 2B and 2C, which are enlarged schematic views of the encircled area 2B, 2C in FIG. 2A, showing parallel probe and wafer planes before and during contact respectively, as can be achieved by the present invention. In FIG. 2B, the dimension of the probe from the top of the bump to the bottom of the lip is 4 mil. During contact as shown in FIG. 2C, the TFI probes have penetrated into the C4 bumps their dimensions have remained unchanged (4 mil) because of the rigid nature of the TFI.

Figure 2D:
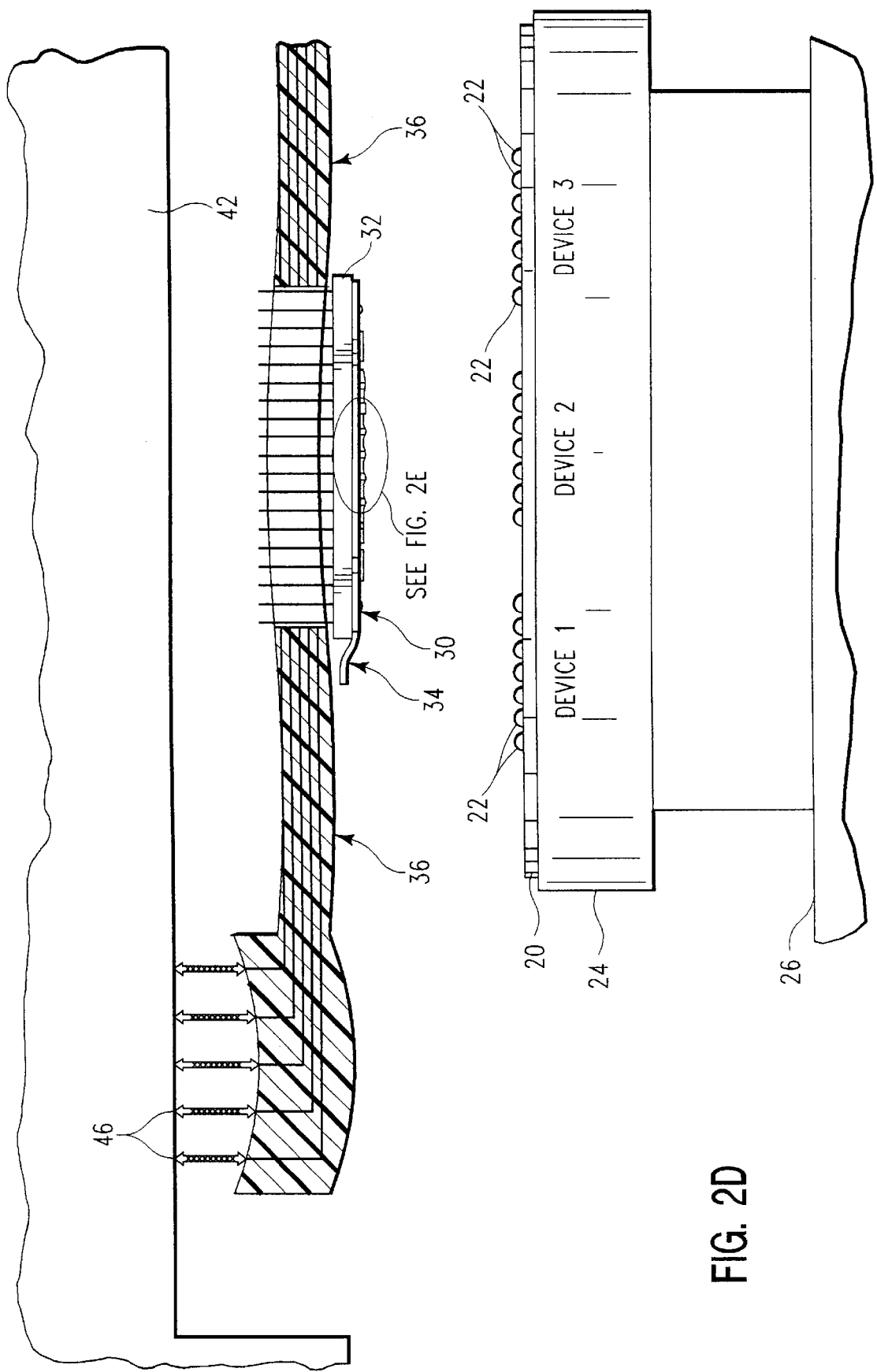
FIGS. 2D and 2F illustrate the development of undesirable bends in test fixtures which have not been optimized according to the present invention, which results in divergence between the planes of the test probes and the C4 pads.
Figure 2F:
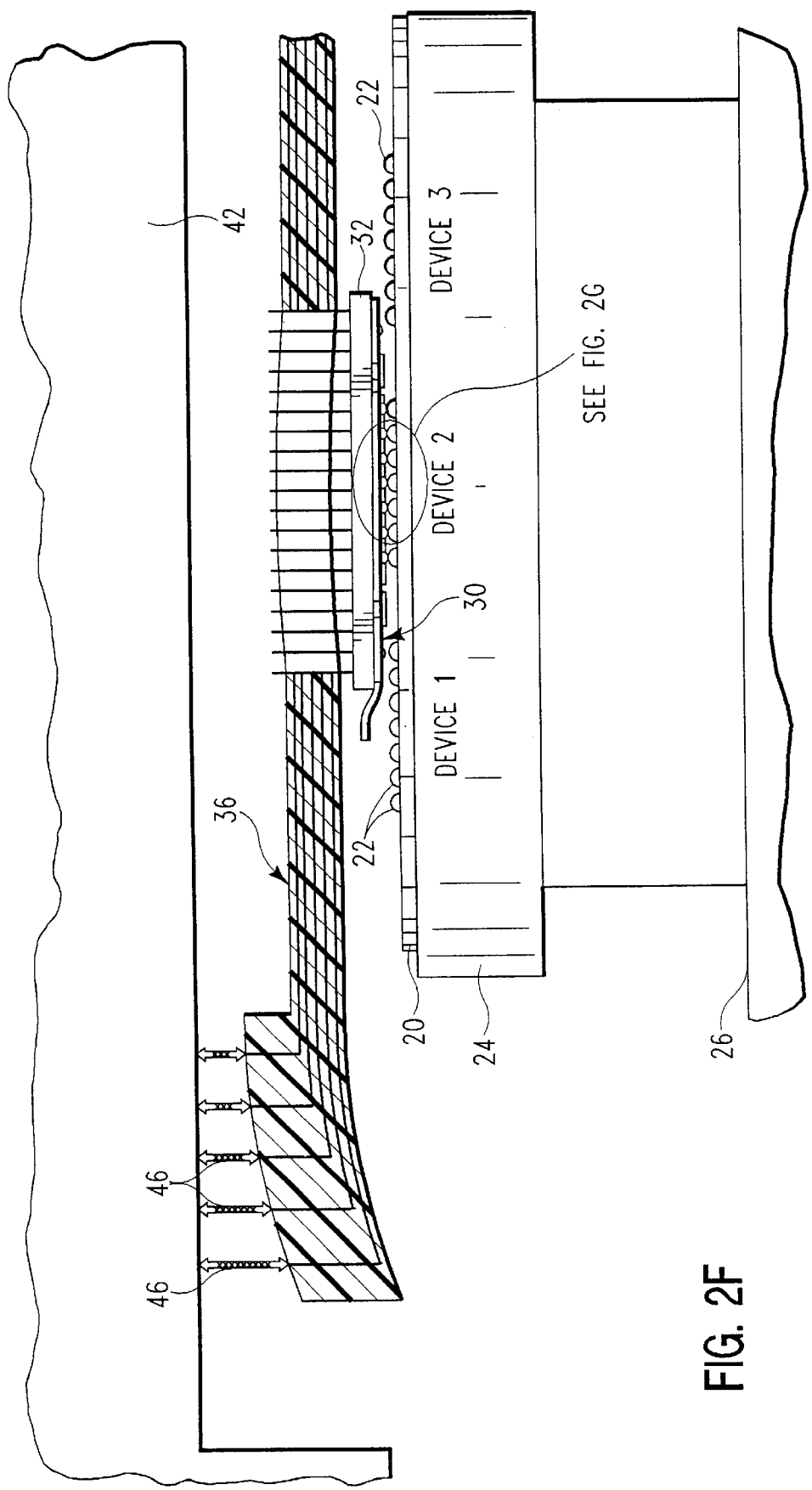

FIGS. 2D and 2F illustrate the development of undesirable bends in test fixtures which have not been optimized according to the present invention, which results in divergence between the planes of the test probes and the C4 pads. FIG. 2E is an enlarged schematic view (not drawn to scale) of the encircled area 2E in FIG. 2D, showing non-planarity between the C4 pads plane and the plane of the probes prior to contact. The probe plane is tilted downwards to the left. FIG. 2G is an enlarged schematic view (not drawn to scale) of the encircled area 2G in FIG. 2F, showing nonuniform probe contact to the C4s. The probe plane is shown to be tilted upwardly to the left, resulting in uneven C4 penetration. The untouched C4 pad (on the left side of the probe) will cause an open circuit and fail in test.

In FIGS. 2D, 2E, 2F and 2G, where divergence between wafer and probe planes was created due to bending of the unconstrained printed circuit board, the penetration into the C4's as uneven which would cause test failures.

Furthermore, conditions of pliancy must be eliminated where the mechanical load of the probe 12 is transmitted through the ceramic space transformer or substrate 32 into the printed circuit (PC) board 36, otherwise the planarity of the probe would be compromised.

Another region in which maintaining planarity is of extreme importance is in the pogo load area 46 of the printed circuit (PC) board 36, which must be held to a close degree of flatness, inasmuch as any bending or arching of the PC board 36 will jeopardize the parallelism between the probe 12 and wafer 20 planes.

In view of the foregoing, the pliability or flexibility of the test system interface assembly 10 has been reduced systematically so as to attain a high degree of probe to wafer planarity. As illustrated in the exploded view of the test fixture assembly shown in FIG. 3, the PC board 36 is mounted to a rigid, non-pliant clamping ring 38 and stiffener 48 so that during testing the PCB does not bend or twist, i.e, remains stable such that it does not go out of planarity. The clamp ring 38 has the precision-ground reference surface 44a which guarantees an in-tool planarity of 0.2–0.5 mil, because no distortion is encountered during compression of the pogo pins 46 by the test-head 42 during probing due to its inherent rigidity and that of the stiffener 48.

The ceramic substrate 32, which is permanently fastened to the PC board 36, utilizes a controlled soldering technique to minimize the rate of soldering. Pins are initially soldered randomly at large distances between solder points to avoid building up of a thermal gradient which might cause distortion in the printed circuit board 36. The ceramic substrate 32 is also fixed in order to render the probe surface in parallel alignment with the precision-ground surface of the clamping ring 38.

The vacuum manifold 34 is permanently bonded by a suitable adhesive to the ceramic substrate 32, utilizing a precision-X-Y-Ø location-adjustment clamping fixture (not shown) which assists in preventing any distortion during the curing process employed for the adhesive. The vacuum fixture is provided with precision-dowel pins which engage in corresponding holes of the probe disc in a tight and close-fitted fashion. This is important in the required probe to device pad contacting.

In summation, the test interface assembly 10 as described hereinabove provides for an extremely high degree of planarity among the various test probe components and remains stable under the application of pogo and probe loading forces.

What is claimed is:

1. An apparatus for testing a wafer, comprising:
   a test system having a first reference surface; and
   an interface assembly mechanically and electrically connected to said test system, said interface assembly comprising a printed circuit board for holding a thin interface pellicle probe or space transformer having conductive pads whereby said pellicle probe is maintained against said conductive pads of said space transformer which is mounted on and electrically contacting said printed circuit board said interface assembly further comprising a clamp ring for rigidly supporting said printed circuit board, said clamp ring having a second reference surface for contact with said first reference surface.

2. The apparatus of claim 1, further comprising a stiffener plate, wherein said printed circuit board is rigidly held by said clamp ring and said stiffener plate to prevent bending of said printed circuit board so as to maintain planarity with the wafer.

3. The apparatus of claim 1, wherein said probe is planar to the wafer within 5 microns.

4. The apparatus of claim 1, further comprising a substrate mounted on said printed circuit board, said probe electrically contacting said substrate.

5. The apparatus of claim 4, further comprising a vacuum fixture for holding said probe to said substrate.

6. The apparatus of claim 4, wherein said electrical contact between said substrate and said printed circuit board is with solder.

7. The apparatus of claim 1, wherein said second reference surface defines a reference plane, further wherein said probe elements have tips that define a probe tip plane that is planar within 5 microns, wherein said probe tip plane is parallel to said reference plane.

8. The apparatus of claim 7, wherein said second reference surface mates with and is in precision reference with said first reference surface and wherein said first reference surface is set to be parallel to the wafer.

9. The apparatus of claim 1, wherein said probe elements are non-resilient probe elements.

10. The apparatus of claim 9, wherein said non-resilient probe elements are mounted to a ceramic substrate which is soldered to said printed circuit board, wherein said ceramic substrate comprises a probe surface and a printed circuit board contact surface, wherein said printed circuit board contact surface is soldered to said printed circuit board, said probe surface in parallel alignment within about 5 $\mu$m to said second reference surface.

11. The apparatus of claim 1, further comprising a stiffener plate, wherein said printed circuit board is rigidly held by said clamp ring and said stiffener plate to prevent bending of said printed circuit board so as to maintain planarity with the wafer, wherein said probe is planar to the wafer within 5 microns, said apparatus further comprising a substrate mounted on said printed circuit board, wherein said electrical contact between said substrate and said printed circuit board is with solder, apparatus further comprising a vacuum fixture for holding said probe to said substrate.

* * * * *

UNITED STATES PATENT AND TRADEMARK OFFICE
CERTIFICATE OF CORRECTION

PATENT NO.       : 6,426,636 B1                                    Page 1 of 1
APPLICATION NO.  : 09/022240
DATED            : July 30, 2002
INVENTOR(S)      : Das et al.

It is certified that error appears in the above-identified patent and that said Letters Patent is hereby corrected as shown below:

Title Page # 75 --John G. Lawson, Barre, VT (US)-- should be added as an additional inventor.

Signed and Sealed this

Seventeenth Day of April, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,426,636 B1 | Page 1 of 1 |
| APPLICATION NO. | : 09/022240 | |
| DATED | : July 30, 2002 | |
| INVENTOR(S) | : Das et al. | |

It is certified that error appears in the above-identified patent and that said Letters Patent is hereby corrected as shown below:

Title Page # 75 --George J. Lawson, Barre, VT (US)-- should be added as an additional inventor.

This certificate supersedes the Certificate of Correction issued Apirl 17, 2007.

Signed and Sealed this

Thirty-first Day of March, 2009

JOHN DOLL
*Acting Director of the United States Patent and Trademark Office*